United States Patent
Kim et al.

[11] Patent Number: 6,146,811
[45] Date of Patent: Nov. 14, 2000

[54] PHOTORESIST USING DIOXASPIRO RING-SUBSTITUTED ACRYL DERIVATIVES

[75] Inventors: Jin Baek Kim, Seoul; Jong Jin Park, Kyounggi-do; Ji Hyun Jang, Pusan, all of Rep. of Korea

[73] Assignee: Korea Advanced Institute of Science and Technology, Taejeon, Rep. of Korea

[21] Appl. No.: 09/364,860

[22] Filed: Jul. 30, 1999

[30] Foreign Application Priority Data

Aug. 1, 1998 [KR]   Rep. of Korea ............... 98-31402

[51] Int. Cl.[7] ............................................. G03F 7/004
[52] U.S. Cl. .................. 430/270.1; 430/905; 430/909; 430/910
[58] Field of Search ............................. 430/270.1, 910, 430/909, 905

[56] References Cited

U.S. PATENT DOCUMENTS

| | | | |
|---|---|---|---|
| 4,927,737 | 5/1990 | Walls et al. | 430/278.1 |
| 5,275,907 | 1/1994 | Walls | 430/157 |
| 5,691,101 | 11/1997 | Ushirogoudhi et al. | 430/176 |

*Primary Examiner*—John S. Chu
*Attorney, Agent, or Firm*—Skjerven Morrill MacPherson LLP; David T. Millers

[57] ABSTRACT

Disclosed is photoresist using dioxaspiro ring-substitued acryl derivatives, represented by the following chemical formula I or II. As matrix polymers, homopolymers of dioxaspiro ring-substitued acryl monomers or their copolymers with acryl monomers are provided. The deprotection of the dioxaspiro rings from the matrix polymers, usually accomplished by the action of a photoacid generator, causes a great change in the water solubility of the matrix, thereby allowing the matrix to be used for the photoresist required to have high sensitivity, resolution and contrast.

6 Claims, No Drawings

PHOTORESIST USING DIOXASPIRO RING-SUBSTITUTED ACRYL DERIVATIVES

BACKGROUND OF THE INVENTION

1. Field of the Invention

The present invention relates to a photoresist superior in resolution, sensitivity and contrast with a high glass transition temperature and, more particularly, to a photoresist using dioxaspiro ring-substitued acryl derivatives.

2. Description of the Prior Art

There have been developed extensive photoresists. Conventional photoresists typically comprise an alkali-soluble phenol-(or cresol-) formaldehyde novolak resin as a binder and substituted naphthoquinone diazide as a photosensitive material, as disclosed in U.S. Pat. Nos. 3,666,473, 4,115,128 and 4,173,470. While the novolak resin is dissolved in an aqueous alkali solution, the naphthoquinone compound plays a role as a dissolution inhibitor. If a substrate coated with this photoresist is selectively exposed to a light beam, the photosensitive material is altered in structure so that the exposed regions of the photoresist coating are more soluble than the unexposed regions. When the substrate is immersed in an aqueous alkali solution, the exposed regions are dissolved at a faster rate with the unexposed regions being etched at a slower rate, resulting in the formation of a relief pattern on the substrate.

With the advance in lithography, the light source is selected from a region of deep ultraviolet which ranges, in wavelength, from 200 to 300 nm. In this light region, however, the naphthoquinone photosensitive material exhibits too great light absorption in addition to being of low sensitivity. Therefore, there has been a demand for the development of novel photoresists capable of effectively functioning in the light.

The novel photoresists are required to be superior in photosensitivity, contrast, resolution and etch resistance. Of them, photosensitivity is the most important. In order to enhance the photosensitivity, there was introduced a chemical amplification concept. In the chemical amplification, the active species generated by a photochemical reaction serves as a catalyst which allows chemical reactions, such as deprotection and crosslinking, to occur continuously, so that the total yield of protons in these reactions is greatly amplified relative to the initial proton yield of the catalyst.

Accordingly, a great interest has recently been taken in chemical amplification-type photoresists to achieve the high sensitivity necessary for the lithography in semiconductor fields. Representative, most powerful resins are t-butoxycarbonyl-protected polyvinylphenols, as reported in U.S. Pat. Nos. 4,311,782, 4,405,708 and 4,491,628. In fact, the resins were found to enhance sensitivity by 100 times greater than do conventional positive novolak photoresists.

SUMMARY OF THE INVENTION

Therefore, it is an object of the present invention to overcome the above problems encountered in prior arts and to provide a photoresist having a high glass transition temperature with superiority in sensitivity, contrast and resolution.

In accordance with the present invention, there is provided a photoresist using a dioxaspiro ring-subtitued acryl derivative, comprising a homopolymer of a dioxaspiro ring-containing acryl derivative, represented by the following general formula I or II, or its copolymer with an acryl derivative.

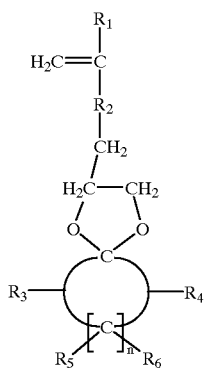

(I)

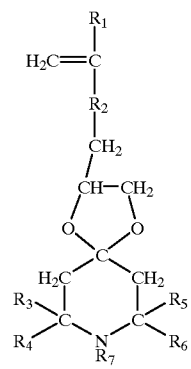

(II)

DETAILED DESCRIPTION OF THE INVENTION

The present invention pertains to a chemical amplification-type photoresist using a photoacid generator. It is prepared by formulating a photoacid generator with a matrix sensitive to an acid. When the photoacid is exposed to light or irradiated with high energy beams, such as X-rays, electron beams, etc., protons, a kind of Bronsted acid, are produced, reacting with the matrix. As a consequence of the reaction between the matrix and the acid, the main chain or side chain of the matrix is decomposed so that its crosslinking state or polar property is greatly altered at the exposed regions. When a developing solution is applied to the matrix, an increase or decrease in the solubility in a developing solution is brought about in the exposed regions, forming a fine pattern.

The photoacid generator is usually selected from onium salts, ammonium salts, oxonium salts and sulfonium salts. Recently, organic sulfonic acid esters have been also reported as photoacid generators.

Reactive to acids, the matrix conventionally contains as a protecting group t-butylester, t-butylcarbonate, t-butoxy and t-butoxycarbonyl, which can be dissociated from the main chain by acids to form carboxylic acid, phenol or alcohol functional groups. It can be exemplified by poly(t-butoxycarbonyloxystyrene) and poly(t-butylmethacrylate). Of the protecting groups, t-butoxycarbonyl group is known to be best in sensitivity. When they are protected by the protecting groups or before they react with acids, polymers sensitive to acids are soluble in organic solvents and insoluble in water. In a deprotected state as a result of the reaction with acids, the polymers are greatly altered in structural polarity so that they are turned soluble in aqueous alkaline solutions.

In the present invention, an acrylic polymer having a dioxaspiro ring is used as a matrix for photoresist. For this, acrylic monomers substitued with dioxaspiro rings are synthesized from various ketones and glycerols by use of Dean stark equipment. In detail, ketones and glycerols are heated, together with an azeotropic mixture of petroleum ether and benzene, in the presence of para-toluene sulfonic acid under reflux while being drained of water by use of Dean stark equipment. As a result of this condensation, there are obtained primary alcohols of dioxaspiro ring structure. The reaction with (meth)acryloyl chloride results in the introduction of dioxaspiro rings to the side chain of an acryl monomer.

Taking account of the requirements that acrylic polymers substitued with dioxaspiro rings have high glass transition temperatures necessary for their processing, the acrylic polymers must be soluble in water upon deprotection of the rings, and the deprotected polymers can be formed into clear patterns, concrete examples of the ketones useful in the present invention include cycloketones, such as cyclopentanone, 2-cyclopenten-1-one, 2-methyl-2-cyclopenten-1-one, cyclohexanone, 2-t-butylcyclohexanone, 4-t-butylcyclohexanone, 3,3,5,5-tetramethyl cyclohexanone, 2-cyclohexen-1-one, 2-chlorocyclohexanone, 3-methyl-2-cyclohexen-1-one, 4,4-dimethyl-2-cyclohexen-1-one, 3,5-dimethyl-2-cyclohexen-1-one, isoporone, 3-ethoxy-2-cyclohexen-1-one, 3-ethoxy-2-methyl-2-cyclohexen-1-one, 3-(2-hydroxyethylamino)-5,5-dimethyl-2-cyclohexen-1-one, 1,2-cyclohexandione, 1,4-cyclohexandione, 1,3-cyclohexandione, cycloheptanone, 1,3-cycloheptadione, cyclooctanone, 2-cyclohepten-1-one, cyclononanone, cyclodecanone, cycloundecanone, cyclododecanone, cyclotridecanone, cyclopentadecanone, 2-adamantanone, bicyclo[3.2.1]octan-2-one, bicyclo[3.3.1]nonan-9-one, 8-cyclohexadecan-1-one, 1,4-cyclohexandione, 4-hydroxy-4-methyl-2-pentanone, norcamphor, 3-chloro-2-norbonanone, 1-decalone, 8-cyclohexadecan-1-one, dicyclopropylketone, dicyclohexylketone, 1-methyl-4-piperidone, 1-ethyl-4-piperidone, 1-propyl-4-piperidone, 2,2,6,6-tetramethyl-4-piperidone monohydrate; aromatic ketones, such as 4-phenylcyclohexanone, 6-methoxy-2-tetralone, 7-methoxy-2-tetralone, 6,7-dimethoxy-2-tetralone, cyclobutylphenylketone, cyclopentylphenylketone, cyclohexylphenylketone, 1-indanone, 2-indanone, 1,3-indandione, alphatetralone, 2-methyl-1-tetralone, 4-methyl-1-tetralone, 5-hydroxyl-1-tetralone, 1-benzosuberone, 8-fluoro-1-benzosuberone, benzophenone, 4-methylbenzophenone, 4-fluorobenzophenone, 4-nitrobenzophenone, 2-benzoylnaphthalene, 9-fluororenone, anthrone, dibenzosuberone, dibenzosuberone, 2-hydroxy-9-fluororenone, and 4-hydroxy-9-fluororenone; and aliphatic ketones, such as 1,4-dioxaspiro[4.5]deca-6,9-dien-8-one, 1,5-dioxaspiro[5.5]undeca-7,10-dien-9-one, acetone, 2-butanone, 1-methyl-2-butanone, pynacolone, 2-pentanone, 3-pentanone, 3-methyl-2-pentanone, and 4-methyl-2-pentanone.

The introduction of dioxaspiro rings to the side chains of acryl monomers is carried out in the presence of a base in a solvent. An available base is exemplified by triethyl amine, pyridine, t-butyl lithium, sodium hydride, and n-butyl lithium. As the solvent, n-pentane, n-hexane, n-heptane, cyclohexane, ethyl ether or tetrahydrofuran is useful.

The polymerization of the monomers follows conventional processes. For instance, 1,4-dioxaspiro[4.5]decane-2-methyl methacrylate, 1,4-dioxaspiro[4.4]nonane-2-methylmethacrylate, 1,4-dioxaspiro[4.6]undecane-2-methyl methacrylate and 1,4-dioxaspiro[4.7]dodecane-2-methyl methacrylate are polymerized, alone or in combination, with the aid of a radical polymerization initiator. t-Butyl methacrylate, tricyclodecanyl methacrylate and isobornyl methacrylate can be copolymerized by bulk polymerization or solution polymerization. For this, cyclohexanone, methylethylketone, benzene, toluene, dioxane and dimethylformamide may be used as a solvent, alone or in combination. The polymerization is conducted with the aid of an initiator usually selected from benzoyl peroxide, 2,2'-azobisisobutyronitrile, acetylperoxide, laurylperoxide and t-butylperacetate.

The acryl derivatives which contain dioxaspiro rings as protecting groups have the following general formula I:

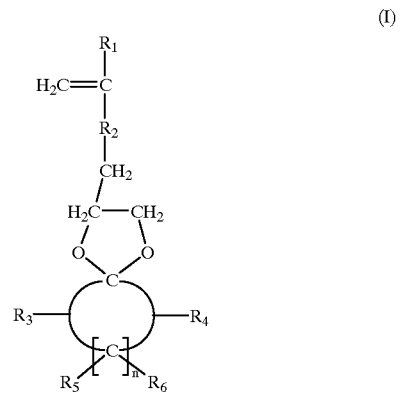

(I)

wherein, $R_1$ is H or $CH_3$; $R_2$ is COO, $C_6H_4$, $C_6H_4O$, $C_6H_4CH_2O$, $C_6H_{10}$, $C_6H_{10}O$ or $C_6H_{10}OCH_2O$; and $R_3$, $R_4$, $R_5$, $R_6$ and n, each, are subjected to one of the following cases:

a) n is an integer of 2 to 16 and $R_3=R_4=R_5=R_6=H$;

b) n is an integer of 2 to 16 and $R_3=R_4=R_5=H$ and $R_6$ is an alkyl group containing 1–5 carbon atoms, $CH_3$, $CH_3O$, $CH_2CH_3$, $CH_2CH_3O$, OH or COOH;

C) n is an integer of 2 to 16 and $R_3=R_5=R_6=H$ and $R_4$ is an alkyl group containing 1–8 carbon atoms, $CH_3$, $CH_3O$, $CH_2CH_3$, $CH_2CH_3O$, OH, COOH, $NO_2$, $NH_2$, or a halogen;

d) n is an integer of 2 to 16 and $R_4=R_5=R_6=H$ and $R_3$ is an alkyl group containing 1–8 carbon atoms, $CH_3$, $CH_3O$, $CH_2CH_3$, $CH_2CH_3O$, OH, COOH, $NO_2$, $NH_2$, or a halogen;

e) n is an integer of 2 to 16 and $R_3=R_4=R_6=H$ and $R_5$ is an alkyl group containing 1–5 carbon atoms; or f) n is 6, $R_4$ is H and $R_3$, $R_5$, and $R_6$, each, are $CH_2$ at positions 1, 3 and 5; or the following general formula II:

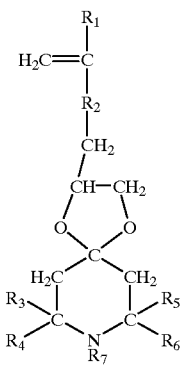
(II)

wherein, $R_1$ is H or $CH_3$; $R_2$ is COO, $C_6H_4$, $C_6H_4O$, $C_6H_4CH_2O$, $C_6H_{10}$, $C_6H_{10}O$ or $C_6H_{10}OCH_2O$; and $R_3$, $R_4$, $R_5$, $R_6$ and $R_7$, each, are subjected to one of the following cases:

a) $R_3=R_4=R_5=R_6=R_7=H$;
b) $R_3=R_4=R_5=R_6=R_7=CH_3$;
c) $R_3=R_4=R_5=R_6=CH_3$ and $R_7=CH_2CH_3$ or $CH_2CH_2CH_3$; or
d) $R_3=R_4=R_5=R_7=H$ and $R_6=OCH_3$ or $OCH_2CH_3$.

In accordance with the present invention, there is provided a polymer having the following general formula III or IV:

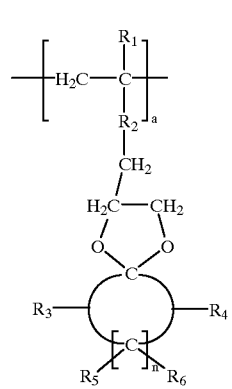
(III)

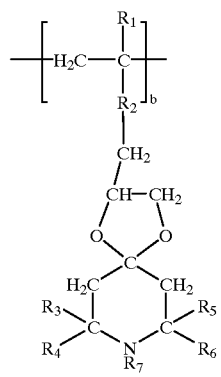
(IV)

wherein, $R_1$ to $R_6$, and n, each, are as defined above; and a and b, each, have a polymerization degree of 10 to 10,000.

Herein, the polymer of the present invention as used, means a homopolymer of dioxaspiro ring-substitued acryl monomers or a copolymer of dioxaspiro ring-substitued acryl monomers and acryl monomers.

The homopolymers of dioxaspiro ring-substitued acryl monomers or their copolymers with acryl monomers are found to be superior in coatability with excellent film-forming aptitude. For instance, poly(1,4-dioxaspiro[4.5] decane-2-methyl methacrylate), poly(1,4-dioxaspiro[4.4] nonane-2-methyl methacrylate) and poly(1,4-dioxaspiro [4.6]undecane-2-methyl methacrylate) are well dissolved in an organic solvent, such as cyclohexane, dioxane, methylethylketone, chloroform, tetrahydrofuran, 2-ethoxyethyl acetate, acetone, etc., while the deprotected products thereof are not soluble in most organic solvents, indicating that the polymers of the present invention can be formed into patterns at a superb efficiency by use of selectivity development. Especially, poly(1,4-dioxaspiro[4.4] nonane-2-methyl methacrylate) and poly(1,4-dioxaspiro [4.6]undecane-2-methyl methacrylate) are readily developed in pure water or weak alkaline aqueous solutions, so that a high resolution of patterns can be achieved with high sensitivity and contrast.

A better understanding of the present invention may be obtained in the light of the following examples which are set forth to illustrate, but are not to be construed to limit the present invention.

PREPARATION EXAMPLE I

Synthesis of 1,4-Dioxaspiro[4.5]decane-2-methanol

In a 250 ml flask were mixed 19.6 g (0.2 M) of cyclohexanone, 24 g (0.26 M) of gylcerol and 0.3 g of para-toluene sulfonic acid, along with 60 g of petroleum ether. After being applied with Dean stark, the flask was heated at 90° C. for 7 hours to give 3.2 g of water.

The petroleum ether collected in the Dean stark was discarded, followed by heating the flask for one hour additionally to recover remaining petroleum ether with the Dean stark equipment. From the mixture, unreacted glycerol was extracted with an extractant (water/ether 1/3) in a separatory funnel, after which the organic layer was developed by column chromatography eluting with hexane/ethyl acetate (3/1) to afford 28.2 g of 1,4-dioxaspiro[4.5]decane-2-methanol (Yield 82%).

PREPARATION EXAMPLE II

Synthesis of 1,4-Dioxaspiro[4.4]nonane-2-methanol

In a 250 ml flask were mixed 16.8 g (0.2 M) of cyclohexanone, 24 g (0.26 M) of glycerol and 0.1 g of para-toluene sulfonic acid, along with 50 g of petroleum ether. After being equipped with Dean stark, the flask was heated at 85° C. for 7 hours to give 3.3 g of water.

The petroleum ether collected in the Dean stark was discarded, followed by heating the flask for one hour additionally to recover remaining petroleum ether with the Dean stark. From the mixture, unreacted glycerol was extracted with an extractant (water/ether 1/3) in a separatory funnel, after which the organic layer was developed by column chromatography eluting with hexane/ethyl acetate (3/1) to afford 25.6 g of 1,4-dioxaspiro[4.4]nonane-2-methanol (Yield 81%).

PREPARATION EXAMPLE III

Synthesis of 1,4-Dioxaspiro[4.6]undecane-2-methanol

In a 250 ml flask were mixed 22.4 g (0.2 M) of cyclohexanone, 24 g (0.26 M) of gylcerol and 0.1 g of para-toluene sulfonic acid, along with 30 g of benzene. After being applied with Dean stark, the flask was heated at 120° C. for 48 hours to give 3.1 g of water.

The petroleum ether collected in the Dean stark was discarded, followed by heating the flask for one hour additionally to recover remaining petroleum ether with the Dean stark. From the mixture, unreacted glycerol was extracted with an extractant (water/ether 1/3) in a separatory funnel, after which the organic layer was developed by column chromatography eluting with hexane/ethyl acetate (3/1) to afford 28.7 g of 1,4-dioxaspiro[4.6]undecane-2-methanol (Yield 77%).

PREPARATION EXAMPLE IV

Synthesis of 1,4-Dioxaspiro[4.7]dodecane-2-methanol

The same procedure as in Preparation Example III was repeated, except that 25 g (0.198 M) of cyclooctanone, 24 g (0.26 M) of gylcerol and 40 g of petroleum ether were reacted in the presence of para-toluene sulfonic acid 0.2 g, to afford 1,4-dioxaspiro[4.7]dodecane-2-methanol 24.6 g (Yield 62%).

PREPARATION EXAMPLE V

Synthesis of 6-methyl-1,4-dioxaspiro[4.4]nonane-2-methanol

The same procedure as in Preparation Example III was repeated, except that 9.85 g (0.1 M) of 2-methylcyclopentanone, 11.96 g (0.13 M) of gylcerol and 30 g of petroleum ether were reacted in the presence of 0.15 g of para-toluene sulfonic acid, to afford 14.6 g of 6-methyl-1,4-dioxaspiro[4.4]nonane-2-methanol (Yield 85%).

PREPARATION EXAMPLE VI

Synthesis of Sprio[1,3-dioxolan-2,2'-decahydronaphthalene]-4-methanol

The same procedure as in Preparation Example III was repeated, except that 15.22 g (0.1 M) of 2-decalone, 11.96 g (0.13 M) of gylcerol and 40 g of petroleum ether were reacted in the presence of 0.15 g of para-toluene sulfonic acid, to afford 18.8 g of spiro[1,3-dioxolan-2,2'-decahydronaphthalene]-4-methanol (Yield 83%).

PREPARATION EXAMPLE VII

Synthesis of 8-Aza-8-methyl-1,4-dioxaspiro[4.5]decane-2-methanol

The same procedure as in Preparation Example III was repeated, except that 22.6 g (0.2 M) of 1-methyl-4-piperidone, 24 g (0.26 M) of gylcerol and 50 g of petroleum ether were reacted in the presence of 0.1 g of para-toluene sulfonic acid, to afford 24.9 g of 8-aza-8-methyl-1,4-dioxaspiro[4.5]decane-2-methanol (Yield 72%).

PREPARATION EXAMPLE VIII

Synthesis of 1,4-Dioxaspiro[4.5]decane-2-methanol methacrylate

In 30 g of anhydrous tetrahydrofuran were dissolved 25 g (0.134 M) of 1,4-dioxaspiro[4.5]decane-2-methanol, obtained in Preparation Example I, and 20 g (0.20 M) of triethyl amine and the resulting solution were poured in a 250 ml flask in which 18 g (0.17 M) of a solution of tetrahydrofuran:methacryloyl chloride (10:1 w/w) were, then, dropwise added through a dropping funnel at 0° C. over 30 min, followed by conducting a reaction for 7 hours. The salts produced during the reaction were filtered off twice. Then, the filtrate was neutralized with sodium hydrogen carbonate, after which the solvent (tetrahydrofuran) was removed with a rotary evaporator. After being dried in vacuo at room temperature for 1 hour to remove the methacryloyl chloride still left, the solution was developed by column chromatography eluting with hexane/ethyl acetate (3/1) to afford 25.7 g of 1,4-dioxaspiro[4.5]decane-2-methyl methacrylate (Yield 80%).

PREPARATION EXAMPLE IX

Synthesis of 1,4-dioxaspiro[4.4]nonane-2-methylmethacrylate

In 30 g of anhydrous tetrahydrofuran were dissolved 21.2 g (0.134 M) of 1,4-dioxaspiro[4.4]nonane-2-methanol, obtained in Preparation Example II, and 20 g (0.2 M) of triethyl amine and the resulting solution was poured in a 250 ml flask in which 18 g (0.17 M) of a solution of tetrahydrofuran:methacryloyl chloride (10:1 w/w) were, then, dropwise added through a dropping funnel at 0° C. over 30 min, followed by conducting a reaction for 8 hours. The rest of the synthesis process was carried out in the same manner as that of Preparation Example VIII to afford 37.1 g of 1,4-dioxaspiro[4.4]nonane-2-methyl methacrylate (Yield 82%).

PREPARATION EXAMPLE X

Synthesis of 1,4-dioxaspiro[4.6]undecane-2-methylmethacrylate

In 30 g of anhydrous tetrahydrofuran were dissolved 25 g (0.134 M) of 1,4-dioxaspiro[4.6]undecane-2-methanol, obtained in Preparation Example III, and 20 g (0.2 M) of triethyl amine and the resulting solution was poured in a 250 ml flask in which 18 g (0.17 M) of a solution of tetrahydrofuran:methacryloyl chloride (10:1 w/w) were, then, dropwise added through a dropping funnel at 0° C. over 30 min, followed by conducting a reaction for 8 hours. The rest of the synthesis process was carried out in the same manner as that of Preparation Example VIII to afford 42.2 g of 1,4-dioxaspiro[4.6]undecane-2-methyl methacrylate (Yield 83%).

PREPARATION EXAMPLE XI

Synthesis of 1,4-dioxaspiro[4.7]dodecane-2-methylmethacrylate

In 30 g of anhydrous tetrahydrofuran were dissolved 26.6 g (0.134 M) of 1,4-dioxaspiro[4.7]dodecane-2-methanol, obtained in Preparation Example IV, and 16.6 g (0.164 M) of triethyl amine and the resulting solution was poured in a 250 ml flask in which 15.6 g (0.149 M) of a solution of tetrahydrofuran:methacryloyl chloride (10:1 w/w) were, then, dropwise added through a dropping funnel at 0° C. over 30 min, followed by conducting a reaction for 8 hours. The rest of the synthesis process was carried out in the same manner as that of Preparation Example VIII to afford 38.6 g of 1,4-dioxaspiro[4.7]dodecane-2-methyl methacrylate (Yield 72%).

PREPARATION EXAMPLE XII

Synthesis of 6-Methyl-1,4-dioxaspiro[4.4]nonane-2-methyl methacrylate

In 30 g of anhydrous tetrahydrofuran were dissolved 14 g (0.08 M) of 6-methyl-1,4-dioxaspiro[4.4]nonane-2- methanol, obtained in Preparation Example V, and 12 g (0.12 M) of triethyl amine and the resulting solution was poured in a 250 ml flask in which 10.8 g (0.1 M) of a solution of tetrahydrofuran:methacryloyl chloride (10:1 w/w) were, then, dropwise added through a dropping funnel at 0° C. over 30 min, followed by conducting a reaction for 8 hours. The rest of the synthesis process was carried out in the same manner as that of Preparation Example VIII to afford 16.41 g of 6-methyl-1,4-dioxaspiro[4.4]nonane-2-methyl methacrylate (Yield 85%).

PREPARATION EXAMPLE XIII

Synthesis of Spiro[1,3-dioxolan-2,2'-decahydronaphthalene]-4-methyl methacrylate Using 18.10 g (0.08 M) of spiro[1,3-dioxolan-2,2'-decahydronaphthalene]-4-methanol, obtained in Preparation Example VI, 12 g (0.12 M) of triethyl amine and 10.8 g (0.1 M) of methacryloyl chloride, the same procedure as in Preparation Example VI was carried out to afford 17.42 g of spiro[1,3-dioxolan-2,2'-decahydronaphthalene]-4-methyl methacrylate (Yield 74%).

PREPARATION EXAMPLE XIV

Synthesis of 8-Aza-8-methyl-1,4-dioxaspiro[4.5]decane-2-methyl methacrylate

Using 13.85 g (0.08 M) of 8-aza-8-methyl-1,4-dioxaspiro[4.5]decane-2-methanol, obtained in Preparation Example VIII, 12 g (0.12 M) of triethyl amine and 10.8 g (0.1 M) of methacryloyl chloride, the same procedure as in Preparation Example VIII was carried out to afford 12.35 g of 8-aza-8-methyl-1, 4-dioxaspiro [4.5] decane-2-methyl methacrylate (Yield 64%).

PREPARATION XV

Synthesis of Poly(1,4-dioxaspiro[4.5]decane-2-methyl methacrylate 3 g of the 1,4-dioxaspiro[4.5]decane-2-methyl methacrylate monomer obtained in Preparation Example VIII were dissolved in a dioxane solvent at a ratio of 1:8 (monomer:solvent) and polymerized at 70° C. for 6 hours under vacuum in a polymerization glass ample with the aid of 5 mol % of a radical polymerization initiator, 2,2'-azobisisobutyronitrile. The polymers were precipitated in hexane for precipitation, vacuum drying of the precipitates at 30° C. for 10 hours gave 1.74 g of poly(1,4-dioxaspiro[4.6]undecane-2-methyl methacrylate) (Yield 58%).

PREPARATION XVI

Synthesis of Poly(1,4-dioxaspiro[4.4]nonane-2-methyl methacrylate 3 g of the 1,4-dioxaspiro[4.4]nonane-2-methyl methacrylate monomer obtained in Preparation Example IX were dissolved in a dioxane solvent at a ratio of 1:8 (monomer:solvent) and polymerized at 70° C. for 4 hours under vacuum in a sealed ampoule with the aid of 5 mol % of a radical polymerization initiator, 2,2'-azobisisobutyronitrile. The polymers were precipitated in hexane for precipitation, vacuum drying of the precipitates at 30° C. for 10 hours gave 1.95 g of poly(1,4-dioxaspiro[4.4]nonane-2-methyl methacrylate) (Yield 60%).

PREPARATION EXAMPLE XVII

Synthesis of Poly(1,4-dioxaspiro[4.6]undecane-2-methyl methacrylate 3 g of the 1,4-dioxaspiro[4.6]undecane-2-methyl methacrylate monomer obtained in Preparation Example X were dissolved in a dioxane solvent at a ratio of 1:8 (monomer:solvent) and polymerized at 70° C. for 4 hours under vacuum in a sealed ampoule with the aid of 5 mol % of a radical polymerization initiator, 2,2'-azobisisobutyronitrile. The polymers were precipitated in hexane for precipitation, vacuum drying of the precipitates at 30° C. for 10 hours gave 1.74 g of poly(1,4-dioxaspiro[4.6]undecane-2-methyl methacrylate) (Yield 58%).

PREPARATION EXAMPLE XVIII

Synthesis of Poly(1,4-dioxaspiro[4.7]dodecane-2-methyl methacrylate 3 g of the 1,4-dioxaspiro[4.7]dodecane-2-methyl methacrylate monomer obtained in Preparation Example XI were dissolved in a dioxane solvent at a ratio of 1:8 (monomer:solvent) and polymerized at 70° C. for 5 hours under vacuum in a sealed ampoule with the aid of 15 mol % of a radical polymerization initiator, 2,2'-azobisisobutyronitrile. The polymers were precipitated in hexane for precipitation, vacuum drying of the precipitates at 30° C. for 10 hours gave 2.16 g of poly(1,4-dioxaspiro[4.7]dodecane-2-methyl methacrylate) (Yield 72%).

PREPARATION EXAMPLE XIX

Synthesis of Poly(6-methyl-1,4-dioxaspiro[4.4]nonane-2-methyl methacrylate 3 g of the 6-methyl-1,4-dioxaspiro[4.4]nonane-2-methyl methacrylate monomer obtained in Preparation Example XII were dissolved in a dioxane solvent at a ratio of 1:8 (monomer:solvent) and polymerized at 70° C. for 3 hours under vacuum in a sealed ampoule with the aid of 10 mol % of a radical polymerization initiator, 2,2'-azobisisobutyronitrile. The polymers were precipitated in hexane for precipitation, vacuum drying of the precipitates at 30° C. for 10 hours gave 1.95 g of poly(6-methyl-1,4-dioxaspiro[4.4]nonane-2-methyl methacrylate) (Yield 65%).

PREPARATION EXAMPLE XX

Synthesis of Poly (spiro [1,3-dioxolan-2,2'-decahydronaphthalene]-4-methyl methacrylate 3 g of the spiro[1,3-dioxolan-2,2'-decahydronaphthalene]-4-methyl methacrylate monomer obtained in Preparation Example XIII were dissolved in a dioxane solvent at a ratio of 1:8 (monomer:solvent) and polymerized at 70° C. for 4 hours under vacuum in a sealed ampoule with the aid of 5 mol % of a radical polymerization initiator, 2,2'-azobisisobutyronitrile. The polymers were precipitated in hexane for precipitation, vacuum drying of the precipitates at 30° C. for 10 hours gave 1.77 g of poly(spiro[1,3-dioxolan-2,2'-decahydronaphthalene]-4-methyl methacrylate (Yield 59%).

PREPARATION EXAMPLE XXI

Synthesis of Poly(8-aza-8-methyl-1,4-dioxaspiro[4.5]decane-2-methyl methacrylate 3 g of the 8-aza-8-methyl-1,4-dioxaspiro[4.5]-2-methyl methacrylate monomer obtained in Preparation Example XIV were dissolved in a dioxane solvent at a ratio of 1:8 (monomer:solvent) and polymerized at 70° C. for 4 hours under vacuum in a sealed ampoule with the aid of 10 mol % of a radical polymerization initiator, 2,2'-azobisisobutyronitrile. The polymers were precipitated in hexane for precipitation, vacuum drying of the precipitates at 30° C. for 10 hours gave 1.86 g of poly(8-aza-8-methyl-1,4-dioxaspiro[4.5]decane-2-methyl methacrylate (Yield 62%).

PREPARATION EXAMPLE XXII

Synthesis of Poly(1,4-dioxaspiro[4.4]nonane-2-methyl methacrylate-co-1,4-dioxaspiro[4.7]dodecane-2-methyl methacrylate)

In 28 g of an anhydrous benzene solvent were dissolved 4.5 g of the 1,4-dioxaspiro[4.4]nonane-2-methyl methacrylate obtained in Preparation Example IX and 2.7 g of the 1,4-dioxaspiro[4.7]dodecane-2-methyl methacrylate obtained in Preparation Example XI which were, then, polymerized at 70° C. for 5 hours under vacuum in a sealed ampoule with the aid of 5 mol % of a radical polymerization initiator, 2,2'-azobisisobutyronitrile. The polymers were precipitated in hexane for precipitation, vacuum drying of the precipitates at 40° C. for 5 hours gave 5.18 g of poly(1,4-dioxaspiro[4.4]nonane-2-methyl methacrylate-co-1,4-dioxaspiro[4.7]dodecane-2-methyl methacrylate) (Yield 72%).

PREPARATION EXAMPLE XXIII

Synthesis of Poly(1,4-dioxaspiro[4.6]undecane-2-methyl methacrylate-co-isobornyl methacrylate)

In an anhydrous dioxane solvent were dissolved 5.08 g of the 1,4-dioxaspiro[4.6]undecane-2-methyl methacrylate obtained in Preparation Example X and 2.22 g of isobornyl methacrylate at a ratio of 1:8 (monomer:solvent), which were, then, polymerized at 70° C. for 4 hours under vacuum in a sealed ampoule with the aid of 5 mol % of a radical polymerization initiator, 2,2'-azobisisobutyronitrile. The polymers were precipitated in hexane or nitromethane-ether (1:1) for precipitation, drying of the precipitates at 40° C. for 10 hours gave 5.4 g of poly(1,4-dioxaspiro[4.6]undecane-2-methyl methacrylate-co-isobornyl methacrylate) (Yield 74%).

PREPARATION EXAMPLE XXIV

Synthesis of Poly(1,4-dioxaspiro[4.4]nonane-2-methyl methacrylate-co-tricyclo[5.2.1.0$^{2.6}$]decyl-8-methyl methacrylate)

In an anhydrous benzene or acetonitrile solvent were dissolved 4.5 g of the 1,4-dioxaspiro[4.4]nonane-2-methyl methacrylate obtained in Preparation Example XII and 2.2 g of tricyclo[5.2.1.0$^{2.6}$]decyl-8-methyl methacrylate at a ratio of 1:4 (monomer:solvent), which were, then, polymerized at 70° C. for 6 hours under vacuum in a sealed ampoule with the aid of 5 mol % of a radical polymerization initiator, 2,2'-azobisisobutyronitrile. The polymers were precipitated in hexane or nitromethane-ether (1:1) for precipitation, drying of the precipitates at 40° C. for 10 hours gave 4.3 g of poly(1,4-dioxaspiro[4.4]nonane-2-methyl methacrylate-co-tricyclo[5.2.1.0$^{2.6}$]decyl-8-methyl methacrylate) (Yield 65%).

PREPARATION EXAMPLE XXV

Synthesis of Poly(1,4-dioxaspiro[4.4]nonane-2-methyl methacrylate-co-t-butyl methacrylate)

In an anhydrous benzene or acetonitrile solvent were dissolved 4.52 g of 1,4-dioxaspiro[4.4]nonane-2-methyl methacrylate and t-butyl methacrylate at a ratio of 1:4 (monomer:solvent), which were, then, polymerized at 70° C. for 6 hours under vacuum in a sealed ampoule with the aid of 10 mol % of a radical polymerization initiator, 2,2'-azobisisobutyronitrile. The polymers were precipitated in hexane or nitromethane-ether (1:1) for precipitation, drying of the precipitates at 40° C. for 10 hours gave 4.6 g of poly(1,4-dioxaspiro[4.4]nonane-2-methyl methacrylate-co-t-butyl methacrylate) (Yield 76%).

EXAMPLE I

In a 30 wt % solution of poly(1,4-dioxaspiro[4.5]decane-2-methyl methacrylate), the resist polymer obtained in Preparation Example XV, in cyclohexanone, triphenylsulfonium hexafluoroarsenate, serving as a photoacid generator, was added at an amount of 2.0 wt % based on the weight of the resist polymer, followed by filtering the solution through a 0.2 µm filter to give a photoresist solution. This photoresist solution was spin-coated at 2,000 rpm at a thickness of 0.6 µm on a silicon wafer which was previously spin-coated at 2,000 rpm with hexamethyldisilazane and prebaked on a 90° C. hot plate for 2 min. Then, the resulting wafer was subjected to prebaking for 2 min on a 90° C. hot plate, contact exposing at an energy of 25 mJ/cm$^2$ by use of a deep ultraviolet stepper, and post exposure-baking for 2 min on a 130° C. hot plate. Immersion for 60 sec in cyclohexanone produced a negative resist figure at a submicron level.

EXAMPLE II

In a 20 wt % solution of poly(1,4-dioxaspiro[4.4]nonane-2-methyl methacrylate), the resist polymer obtained in Preparation Example XV, in a mixed solvent of acetonitrile:cyclohexanone 1:4, triphenylsulfonium hexafluoroarsenate, serving as a photoacid generator, was added at an amount of 5.0 wt % based on the weight of the resist polymer, followed by filtering the solution through a 0.2 µm filter to give a photoresist solution. This photoresist solution was spin-coated at 2,500 rpm at a thickness of 0.7 µm on a silicon wafer which was previously spin-coated at 2,000 rpm with hexamethyldisilazane and prebaked on a 90° C. hot plate for 2 min. Then, the resulting wafer was subjected to prebaking for 2 min on a 11° C. hot plate, contact exposing at an energy of 20 mJ/cm$^2$ by use of a deep ultraviolet stepper, and post exposure-baking for 2 min on a 110° C. hot plate. Immersion for 60 sec in deionized water or a 0.8 wt % aqueous tetramethylammonium hydroxide solution produced a positive resist figure of a submicron level.

EXAMPLE III

A photoresist solution was obtained in a similar manner to that of Example II, except for using poly(1,4-dioxaspiro[4.6]undecane-2-methyl methacrylate), the resist polymer obtained in Preparation Example XVII, and spin-coated at 3,000 rpm at a thickness of 0.8 µm on a silicon wafer which then, experienced the same exposure and post baking processes as in Example II. Immersion for 60 sec in deionized water or a 0.8 wt % aqueous tetramethylammonium hydroxide solution produced a positive resist figure of a submicron level.

EXAMPLE IV

A photoresist solution was obtained in a similar manner to that of Example II, except for using poly(1,4-dioxaspiro[4.7]dodecane-2-methyl methacrylate), the resist polymer obtained in Preparation Example XVIII, and spin-coated at 2,500 rpm at a thickness of 0.7 µm on a silicon wafer which then, was subjected to prebaking for 1 min on a 90° C. hot plate, contact-exposing at an energy of 30 mJ/cm$^2$ by use of a deep ultraviolet stepper and post exposure-baking for 1 min on a 90° C. hot plate. Immersion for 15 sec in a 10 wt % butanol solution and then, for 40 sec in an aqueous 2.38 wt % methylammonium hydroxide solution produced a positive resist figure of a submicron level.

EXAMPLE V

A photoresist solution was obtained in a similar manner to that of Example II, except for using poly(6-methyl-1,4-dioxaspiro[4.4]nonane-2-methyl methacrylate), obtained in Preparation Example XIX, and spin-coated at 3,000 rpm at a thickness of 0.8 $\mu$m on a silicon wafer which then, experienced the same exposure and post baking processes as in Example II. Immersion for 60 sec in deionized water or a 0.8 wt % aqueous tetramethylammonium hydroxide solution produced a positive resist figure of a submicron level.

EXAMPLE VI

A photoresist solution was obtained in a similar manner to that of Example II, except for using poly(spiro[1,3-dioxolan-2,2'-decahydronaphthalene]-4-methyl methacrylate), obtained in Preparation Example XX, and spin-coated at 2,500 rpm at a thickness of 0.6 $\mu$m on a silicon wafer which then, experienced the same exposure and post baking processes as in Example IV. Immersion for 15 sec in a 10 wt % butanol solution and then, for 90 sec in a 2.38 wt % aqueous tetramethylammonium hydroxide solution produced a positive resist figure in a submicron level.

EXAMPLE VII

In a 20.0 wt % solution of poly(1,4-dioxaspiro[4.5] decane-2-methyl methacrylate), obtained in Preparation Example XV, in cyclohexanone, triphenylsulfonium hexafluoroarsenate, serving as a photoacid generator, was added at an amount of 12.0 wt % based on the weight of the resist polymer, followed by filtering the solution through a 0.2 $\mu$m filter to give a photoresist solution. This photoresist solution was spin-coated at 2,000 rpm at a thickness of 0.6 $\mu$m on a silicon wafer. Then, the resulting wafer was subjected to prebaking for 1 min on a 90° C. hot plate, contact exposing at an energy of 30 mJ/cm$^2$ by use of a deep ultraviolet stepper, and post exposure-baking for 1 min on a 100° C. hot plate. Immersion for 90 sec in an aqueous 2.38 wt % tetramethylammoniumhydroxide solution produced a positive resist figure in a submicron level.

EXAMPLE VIII

A photoresist solution was obtained in a similar manner to that of Example II, except for using poly(1,4-dioxaspiro[4.4] nonane-2-methyl methacrylate-co-1,4-dioxaspiro[4.7] dodecane-2-methyl methacrylate), obtained in Preparation Example XXII, and spin-coated at 2,000 rpm at a thickness of 0.5 $\mu$m on a silicon wafer which then, experienced the same exposure and post baking processes as in Example II. Immersion for 60 sec in a 1.2 wt % aqueous tetramethylammonium hydroxide solution produced a positive resist figure in a submicron level.

EXAMPLE IX

A photoresist solution was obtained in a similar manner to that of Example II, except for using poly(1,4-dioxaspiro[4.6] undecane-2-methyl methacrylate-co-isobornyl methacrylate), obtained in Preparation Example XXIII, and spin-coated at 2,000 rpm at a thickness of 0.9 $\mu$m on a silicon wafer which then, experienced the same exposure and post baking processes as in Example II. Immersion for 60 sec in a 2.38 wt % aqueous tetramethylammonium hydroxide solution produced a positive resist figure in a submicron level.

EXAMPLE X

A photoresist solution was obtained in a similar manner to that of Example II, except for using poly(1,4-dioxaspiro[4.4] nonane-2-methyl methacrylate-co-tricyclo[5.2.1.0$^{2,6}$]decyl methacrylate), obtained in Preparation Example XXIV, and spin-coated at 2,000 rpm at a thickness of 0.7 $\mu$m on a silicon wafer which then, experienced the same exposure and post baking processes as in Example II. Immersion for 60 sec in a 2.38 wt % aqueous tetramethylammonium hydroxide solution produced a positive resist figure in a submicron level.

EXAMPLE XI

A photoresist solution was obtained in a similar manner to that of Example II, except for using poly(1,4-dioxaspiro[4.6] nonane-2-methyl methacrylate-co-t-butyl methacrylate), obtained in Preparation Example XXIII, and spin-coated at 2,500 rpm at a thickness of 0.7 $\mu$m on a silicon wafer which then, experienced the same exposure and post baking processes as in Example II. Immersion for 60 sec in deionized water or a 0.8 wt % aqueous tetramethylammonium hydroxide solution produced a positive resist figure in a submicron level.

As described hereinbefore, the polymers polymerized from acryl monomers containing dioxaspiro ring derivatives have high glass transition temperatures necessary for the processing of photoresists, so they are useful as matrix polymers of photoresists. In addition, the deprotection of the dioxaspiro rings from them, which is accomplished by the acid from photoacid generators, makes the matrix polymers soluble in water. Therefore, with superiority in film-forming aptitude, sensitivity and resolution, the polymers of the present invention can be used for the photoresist which can form patterns in a submicron level.

The present invention has been described in an illustrative manner, and it is to be understood the terminology used is intended to be in the nature of description rather than of limitation. Many modifications and variations of the present invention are possible in light of the above teachings. Therefore, it is to be understood that within the scope of the appended claims, the invention may be practiced otherwise than as specifically described.

What is claimed is:

1. A photoresist using a dioxaspiro ring-substitued acryl derivative, comprising a homopolymer of a dioxaspiro ring-containing acryl derivative, represented by the following general formula I, or its copolymer with an acryl derivative:

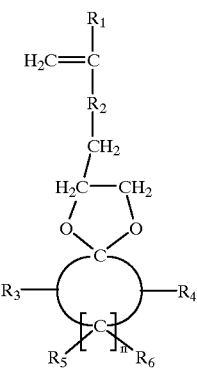

(I)

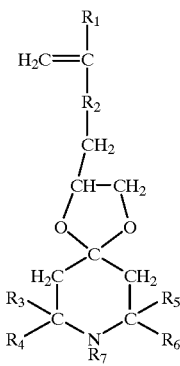

(II)

wherein, $R_1$ is H or $CH_3$; $R_2$ is COO, $C_6H_4$, $C_6H_4O$, $C_6H_4CH_2O$, $C_6H_{10}$, $C_6H_{10}O$ or $C_6H_{10}OCH_2O$; and $R_3$, $R_4$, $R_5$, $R_6$ and n, each, are subjected to one of the following cases:

a) n is an integer of 2 to 16 and $R_3=R_4=R_5=R_6=H$;

b) n is an integer of 2 to 16 and $R_3=R_4=R_5=H$ and $R_6$ is an alkyl group containing 1–5 carbon atoms, $CH_3$, $CH_3O$, $CH_2CH_3$, $CH_2CH_3O$, OH or COOH;

c) n is an integer of 2 to 16 and $R_3=R_5=R_6=H$ and $R_4$ is an alkyl group containing 1–8 carbon atoms, $CH_3$, $CH_3O$, $CH_2CH_3$, $CH_2CH_3O$, OH, COOH, $NO_2$, $NH_2$, or a halogen;

d) n is an integer of 2 to 16 and $R_4=R_5=R_6=H$ and $R_3$ is an alkyl group containing 1–8 carbon atoms, $CH_3$, $CH_3O$, $CH_2CH_3$, $CH_2CH_3O$, OH, COOH, $NO_2$, $NH_2$, or a halogen;

e) n is an integer of 2 to 16 and $R_3=R_4=R_6=H$ and $R_5$ is an alkyl group containing 1–5 carbon atoms; or f) n is 6, $R_4$ is H and $R_3$, $R_5$ and $R_6$, each, are $CH_2$ at positions 1, 3 and 5.

2. A photoresist as set forth in claim 1, wherein said dioxaspiro ring-containing acryl derivative is represented by the following general formula II:

wherein, $R_1$ is H or $CH_3$; $R_2$ is COO, $C_6H_4$, $C_6H_4O$, $C_6H_4CH_2O$, $C_6H_{10}$, $C_6H_{10}O$ or $C_6H_{10}OCH_2O$; and $R_3$, $R_4$, $R_5R_6$ and $R_7$, each, are subjected to one of the following cases:

a) $R_3=R_4=R_5=R_6=R_7=H$;

b) $R_3=R_4=R_5=R_6=R_7=CH_3$;

c) $R_3=R_4=R_5=R_6=CH_3$ and $R_7=CH_2CH_3$ or $CH_2CH_2CH_3$; or d) $R_3=R_4=R_5=R_7=H$ and $R_6=OCH_3$ or $OCH_2CH_3$.

3. A photoresist as set forth in claim 1 or 2, wherein the homopolymer or copolymer is changed in water solubility by the deprotection action of an onium salt on the dioxaspiro ring, the oninum salt serving as a photoacid generator.

4. A photoresist as set forth in claim 1 or 2, wherein the acryl derivative contains at least one protecting group selected from the group consisting of hydropyrane, t-butyl ester, t-butylcarbonate and t-butoxycarbonyl.

5. A photoresist as set forth in claim 1 or 2, wherein the photoresist is patterned with the aid of a photomask, said photomask being brought into contact with a coating film or being spaced apart from a coating film upon exposure.

6. A photoresist as set forth in claim 1 or 2, wherein the homopolymer or copolymer is developed in a solution selected from the group consisting of cellosove acetate, propanol, cyclohexanone, xylene, butyl cellosolve, butyl carbitol, propylene glycol monoethyl ether, propylene glycol, trichloroethane, trichloroethylene, modified chloroethane, isopropanol, dichloromethane, dioxane, methylethylketone, chloroform, tetrahydrofuran hydroxide, 2-ethoxyethylacetate, acetone, an aqueous potassium hydroxide solution, a sodium hydroxide solution, an aqueous potassium carbonate, an aqueous sodium phosphate solution, ammonia water, an aqueous amine solution, silicon surfactant and mixtures thereof.

\* \* \* \* \*